United States Patent [19]
Kosugi

[11] Patent Number: 5,708,227
[45] Date of Patent: Jan. 13, 1998

[54] ELECTRONIC MUSICAL INSTRUMENT

[75] Inventor: Taichi Kosugi, Shizuoka-ken, Japan

[73] Assignee: Kabushiki Kaisha Kawai Gakki Seisakusho, Shizuoka-Ken, Japan

[21] Appl. No.: 747,994

[22] Filed: Nov. 12, 1996

Related U.S. Application Data

[63] Continuation of Ser. No. 351,612, Dec. 8, 1994, abandoned.

[30] Foreign Application Priority Data

Dec. 28, 1993 [JP] Japan .................. 5-350731

[51] Int. Cl.⁶ .................. G10H 1/18; H03K 17/94; H03M 11/00
[52] U.S. Cl. .................. 84/617; 84/621; 341/24; 341/26
[58] Field of Search .................. 84/615, 617, 621, 84/626; 341/24–26

[56] References Cited

U.S. PATENT DOCUMENTS

| | | | |
|---|---|---|---|
| 4,182,210 | 1/1980 | Nishimoto | 84/615 |
| 4,644,841 | 2/1987 | Nagashima et al. | 84/615 |
| 4,932,303 | 6/1990 | Kimpara | 84/621 |
| 5,446,237 | 8/1995 | Abe et al. | 84/617 |

Primary Examiner—Stanley J. Witkowski
Attorney, Agent, or Firm—Westman, Champlin & Kelly, P.A.

[57] ABSTRACT

In an electronic musical instrument which generates musical tone signals based on playing information input from a key switch circuit 10, a key scan circuit 11 includes a decode circuit 22 to which the current status information and the previous status information read out from a scan data memory 21 are input, and if status information which cannot be processed is input, the decode circuit 22 converts it to status information which can be processed, and if there is no empty space in an output data buffer 24, the decode circuit 22 detects no status change. Such construction allows malfunction to be prevented with a simple construction.

5 Claims, 13 Drawing Sheets

FIG. 9A

SCAN DATA MEMORY

| ADDRESS | 7 | 6 5 4 3 2 1 0 | |
|---|---|---|---|
| 000 | S1 | S1 CHATTERING DATA | ⎫ CD1 [k] |
| 001 | S1 | S1 CHATTERING DATA | ⎬ 128 WORDS |
| ⋮ 07F | | | ⎭ (FOR 128 KEYS) |
| 080 | S2 | S2 CHATTERING DATA | ⎫ CD2 [k] |
| ⋮ 0FF | | | ⎬ 128 WORDS ⎭ |
| 100 | S1 OLD | TOUCH DATA (LOW) | ⎫ TDL [k] |
| ⋮ 17F | | | ⎬ 128 WORDS ⎭ |
| 180 | S2 OLD | TOUCH DATA (HIGH) | ⎫ TDH [k] |
| ⋮ 1FF | | | ⎬ 128 WORDS ⎭ |

FIG. 9B

OUTPUT DATA BUFFER

| ADDRESS | 7 | 6 5 4 3 2 1 0 | |
|---|---|---|---|
| 00 | OFF/ON | KEY NUMBER | ⎫ |
| ⋮ 1F | | | ⎬ 32 WORDS ⎭ |
| 20 | S1/S2 | TOUCH DATA (HIGH) | ⎫ |
| ⋮ 3F | | | ⎬ 32 WORDS ⎭ |

| FUL | S10L | S20L | S1CR | S2CR | S1NW | S2NW | KEVN | | INPUT STATUS |
|---|---|---|---|---|---|---|---|---|---|
| 0 | 0 | 0 | 0 | 0 | 0 | 0 | | | |
| 0 | 0 | 0 | 0 | 1 | 0 | 0 | ☆ | | ERROR |
| 0 | 0 | 0 | 1 | 0 | 1 | 0 | | | |
| 0 | 0 | 0 | 1 | 1 | 1 | 0 | ☆ | | SIMULTANEOUS ON |
| 0 | 0 | 1 | 0 | 0 | 0 | 0 | | | ERROR |
| 0 | 0 | 1 | 0 | 1 | 0 | 0 | ☆ | | ERROR |
| 0 | 0 | 1 | 1 | 0 | 0 | 0 | ☆ | | ERROR |
| 0 | 0 | 1 | 1 | 1 | 1 | 1 | | | ERROR |
| 0 | 1 | 0 | 0 | 0 | 0 | 0 | | OFF | |
| 0 | 1 | 0 | 0 | 1 | 0 | 0 | ☆ | OFF | ERROR |
| 0 | 1 | 0 | 1 | 0 | 1 | 0 | | | |
| 0 | 1 | 0 | 1 | 1 | 1 | 1 | | ON | |
| 0 | 1 | 1 | 0 | 0 | 1 | 0 | ☆ | | SIMULTANEOUS OFF |
| 0 | 1 | 1 | 0 | 1 | 1 | 1 | ☆ | | ERROR |
| 0 | 1 | 1 | 1 | 0 | 1 | 0 | | | |
| 0 | 1 | 1 | 1 | 1 | 1 | 1 | | | |
| 1 | 0 | 0 | X | X | 0 | 0 | ? | | |
| 1 | 0 | 1 | X | X | 0 | 1 | ? | | |
| 1 | 1 | 0 | X | X | 1 | 0 | ? | | |
| 1 | 1 | 1 | X | X | 1 | 1 | ? | | |

ELECTRONIC MUSICAL INSTRUMENT

This is a continuation of application Ser. No. 08/351,612, filed Dec. 8, 1994, now abandoned. Priority of the prior application is claimed pursuant to 35 USC § 120.

BACKGROUND OF THE INVENTION

1. Field of the Invention

The present invention is related to an electronic musical instrument, and particularly to an electronic musical instrument comprising a touch detection device for a keyboard which can prevent malfunction with a simple construction.

2. Description of the Prior Art

The touch detector circuit of the conventional electronic musical instrument scans the two switches of the keyboard, respectively, to read their respective status information. Then, according to the combination of the respective switches, it outputs information such as key-on or key-off. In addition, touch strength (speed) information is calculated from the difference between the time at which the first switch operating first turns on and the time at which the second switch operating later turns on.

In the conventional electronic musical instrument as described above, there is a problem that a noise or the like may cause the inputting or generation of such information that the first switch operating first is off and the second switch operating later is on, which leads to malfunction. Also, there is a problem that rarely, the status information that the first switch operating first and the second switch operating later simultaneously change to on may be input, and wrong touch information would be output if such information is input.

SUMMARY OF THE INVENTION

It is the object of the present invention to improve the problems of the prior art as described above, and provide an electronic musical instrument which can prevent malfunction with a simple construction.

The present invention is characterized in that, in an electronic musical instrument which generates musical tone signals based on playing information input from a keyboard, a decode means is provided in a key scan circuit, to which the current status information and the previous status information read out from a memory means are input, and if status information which cannot be processed is input, the decode means converts it to information which can be processed and outputs it.

In accordance with the present invention, since such decode means is provided in the key scan circuit, wrong event data or touch data can be prevented from being output, and there is no need for a additional circuit for preventing wrong data output, whereby the construction is simplified.

BRIEF DESCRIPTION OF THE DRAWING

FIGS. 9A and 9B are figures showing the memory map of the memory and buffer.

DETAILED DESCRIPTION OF THE PREFERRED EMBODIMENT

Figure 1:
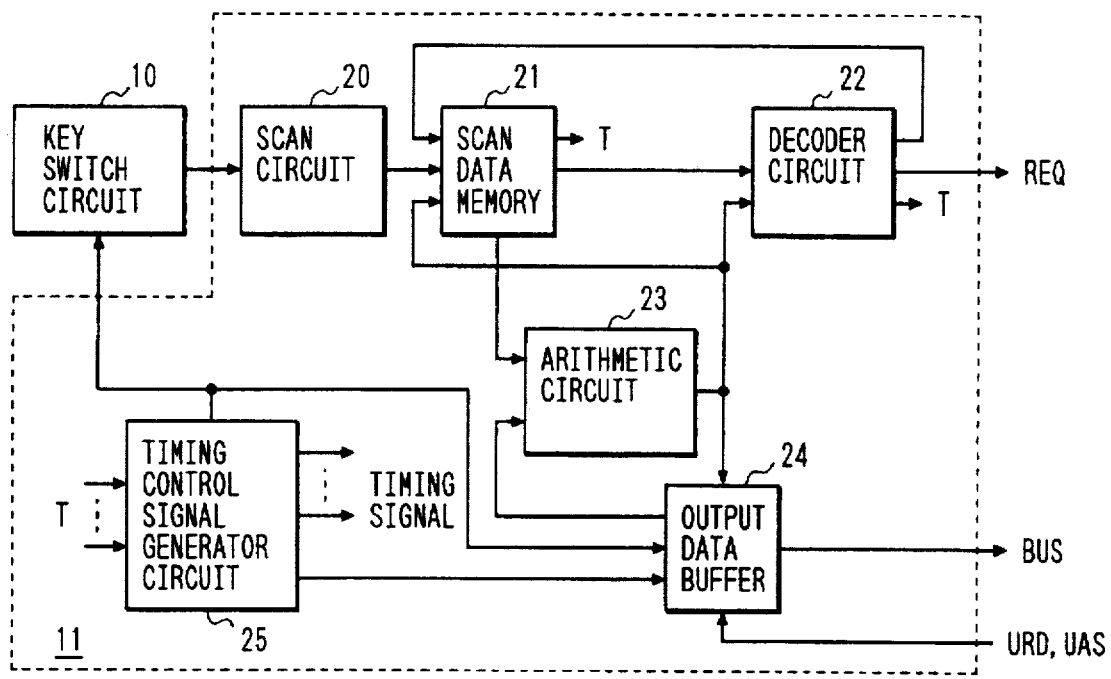
FIG. 1 is a block diagram showing the construction of the key scan circuit of the present invention.

Now, an embodiment of the present invention is described in detail with reference to the drawing.

Figure 2:
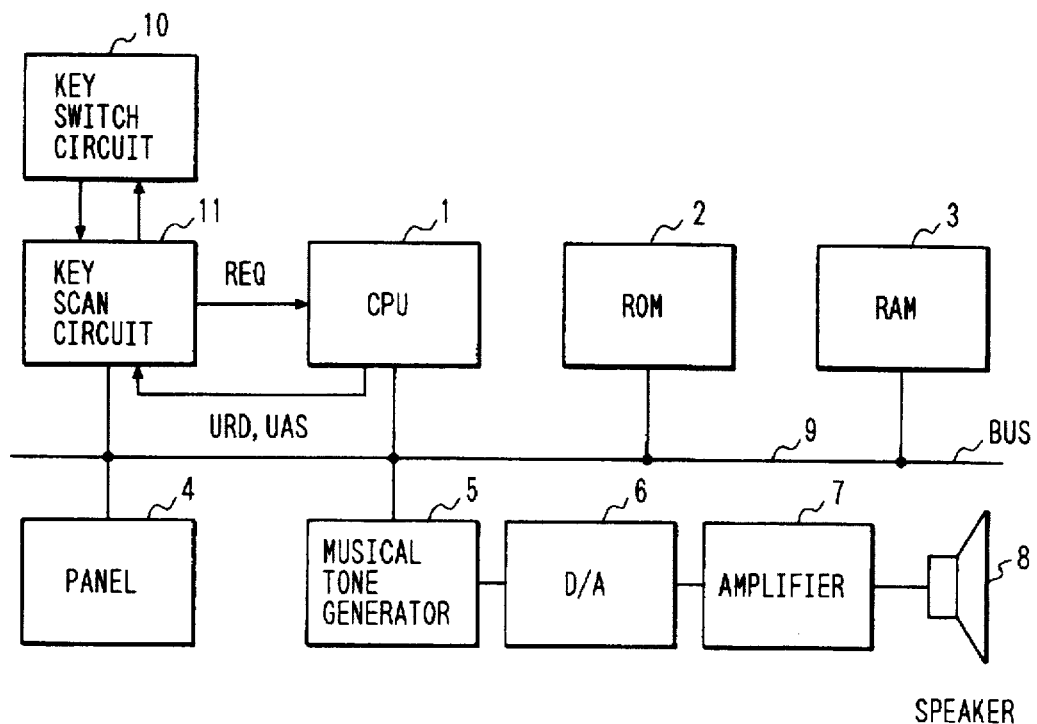
FIG. 2 is a block diagram representing the hardware configuration of the electronic musical instrument of the present invention.

FIG. 2 is a block diagram representing the hardware configuration of an electronic musical instrument to which the present invention is applied. A CPU 1 is to perform the total control of the electronic musical instrument such as key assign and tone generation control, and has an input terminal for a signal REQ from a key scan circuit 11 and an output terminal for a key scan circuit control signal. In a ROM 2, a control program and data such as envelope are stored. In RAM 3, panel setting information, various control information in the instrument, or input automatic playing data are stored. In addition, at least part of them is backed up by a battery, so that information can be held even if power is turned off.

A panel 4 comprises a panel provided with operation switches, volume controllers and a display such as liquid crystal or LED, a circuit for scanning the switches of the panel, and a driver circuit for the display. A musical tone generator circuit 5, for instance, read waveform information at an address interval corresponding to the pitch of the input playing information from a waveform memory in which waveforms are prestored, to generate and synthesize a plurality of independent digital musical tone signals. A D/A converter 6 is converts the synthesized digital musical tone signals. An amplifier 7 is amplifies the musical tone signals to drive a speaker 8. A bus 9 interconnects each circuit in the electronic musical instrument.

A key switch circuit 10 consists of, for instance, two switches provided in each of a plurality of keys, and the first switch (S1) of the two switches operates first at the time of key-on, and the second switch (S2) operates later. A key scan circuit 11, the details of which are described later, autonomously scans the key switch circuit 10 to detect event information such as switch-on and switch-off, and calculates and reports touch strength data to the CPU 1. In addition, a MIDI interface circuit, a floppy disk interface circuit, a memory card interface circuit and the like may be provided.

FIG. 1 is a block diagram showing the construction of the key scan circuit 11 to which the present invention is applied.

From a timing control signal generator circuit 25, signals for scanning the key switches are sent out. The scan signals output from the key switch circuit 10 are converted to serial signals by a scan circuit 20, and sequentially written to a scan data memory 21. FIG. 9A is a figure showing the memory map of the scan data memory 21. S1 and S2 are one-bit data showing the status of the key switches, which are output from the scan circuit, respectively. S1OLD and S2OLD are the previous status signals which are output from a decoder circuit 22 and stored. Chattering data is timing calculation data for preventing chattering, and described later. Touch data is calculation data for determining the touch strength (speed) from the difference in time of the switches turning on. In addition, (High) means the upper seven-bit data, and (Low) means the lower seven-bit data.

The decoder circuit 22 generates a status signal which can be processed, based on the status signal output from the scan data memory 21, or the like, and outputs it to the scan data memory. In addition, based on the status information, it detects the occurrence of an event (key-on, key-off) and informs the timing control signal generator circuit 25 of this, and sends out a request signal REQ to the CPU 1. The timing control signal generator circuit 25 generates various control signals base on a clock. Upon receipt of a notification (KEVN) of an event from the decoder circuit 22, it writes the event data to a output data buffer 24. FIG. 9B is a figure showing the memory map of the output data buffer 24. This buffer consists of a RAM, and is used as a FIFO-type buffer which can store data up to 32 events. The ON/OFF bit represents on/off of the switches, key number is the number of a detected key (pitch information), S1/S2 identifies the switches, and touch data (High) is the value of the upper seven bits of the touch strength data determined by using the scan data memory 21. An arithmetic circuit 23 is an arithmetic circuit (subtracter) which performs a time sharing processing of the calculation of touch data, the calculation for chattering removal, and the address calculation of the output buffer means during the processing period of each key.

The construction of each circuit is described below.

Figure 3:
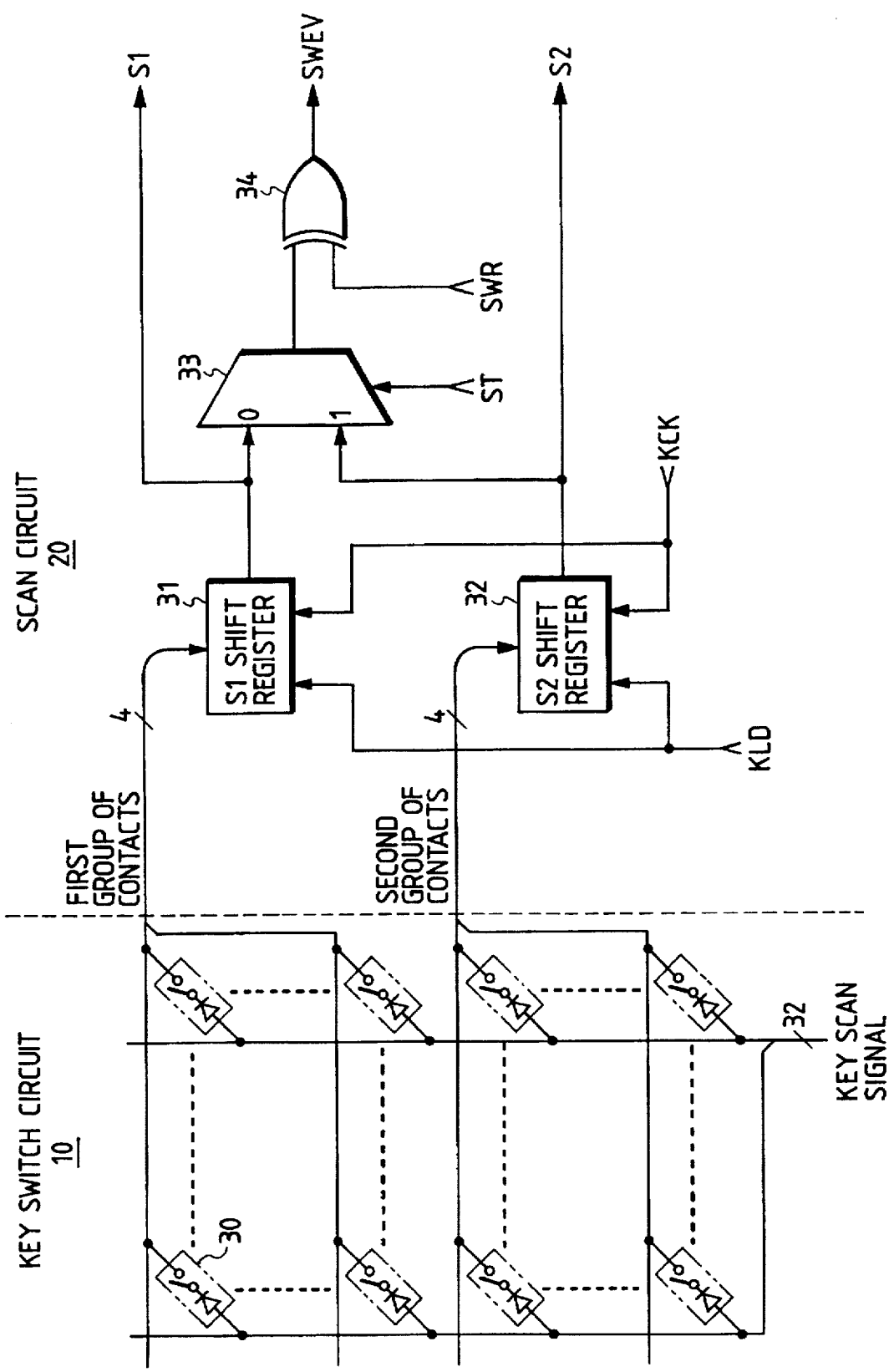
FIG. 3 is a block diagram showing the key switch circuit and key-scan circuit of the present invention.

FIG. 3 is a block diagram showing the construction of the key switch circuit 10 and the scan circuit 20. From the timing control signal generator circuit 25, 32 key scan signals are generated. The signals are input to two shift registers 31 and 32 through each switch in the key switch circuit 10, and output to the scan data memory 21 as serial data S1 and S2. Further, the two signals are exclusive ORed with the previously scanned and input status signal SWR of S1/S2 which is output from the scan data memory 21, and a signal SWEV of detecting a status change of the switches is output to the timing control signal generator circuit 25. 33 is a selector and 34 is an EXOR gate.

Figure 4:
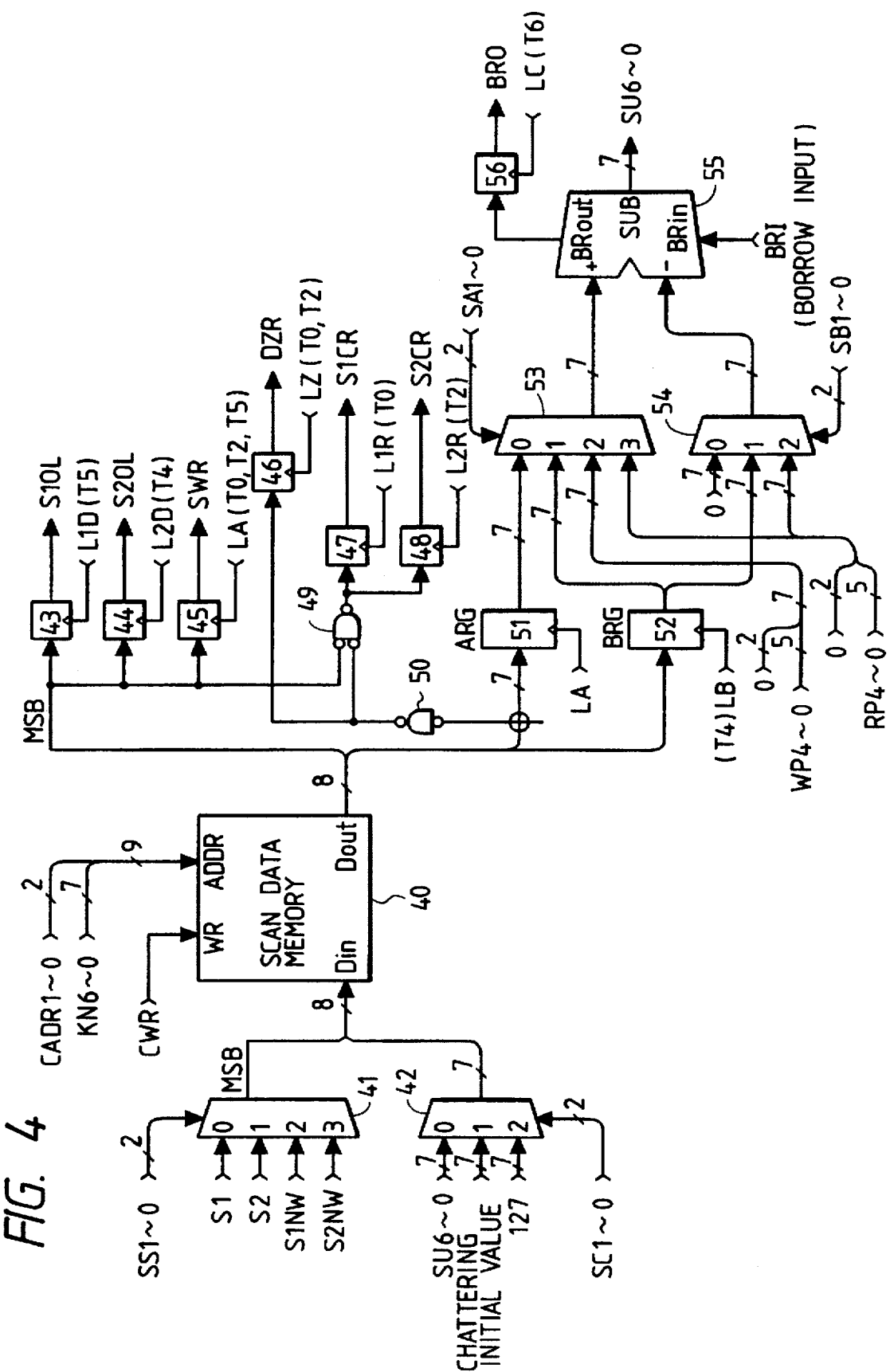
FIG. 4 is a block diagram showing the scan data memory and arithmetic circuit of the present invention.

FIG. 4 is a block diagram showing the construction of the scan data memory 21 and the arithmetic circuit 23. Selectors 41 and 42 select data to be written to a memory 40. Input signals S1 and S2 are written to the areas of S1 and S2 in FIG. 9A, and S1NW and S2NW generated from the decoder circuit 22 are written to the areas of S1OLD and S2OLD in FIG. 9A, respectively. In the lower seven bits of the memory, data selected by the selector 42 is stored at the same time. In addition, to the lower seven bits of the address, key number data KN6-0 are supplied.

Data read out from the memory is latched at necessary timings by one-bit latches 43 to 48 and seven-bit latches 51 and 52. S1OLD and S2OLD are latched in the latches 43 and 44, and S1/S2 is latched in the latch 48. The output of an OR gate 50 that is a logical OR of the seven bits of chattering data, is latched in the latch 46. Signals representing logical OR of S1, S2 and the output of the OR gate 50 by an OR circuit 49 is latched in the latches 47 and 48, respectively. These signals are output to the decoder circuit 22 as status signals S1CR and S2CR from which chattering was removed. A seven-bit subtracter 55, selectors 53 and 54, and latches 51, 52 and 56 make up the arithmetic circuit 23, and perform various subtraction processings at the timings described later. BRin of the subtracter 55 is a borrow signal input terminal to which a BRI signal becoming one when various decrements are necessary is input, and BRout is a borrow output terminal.

Figure 5:
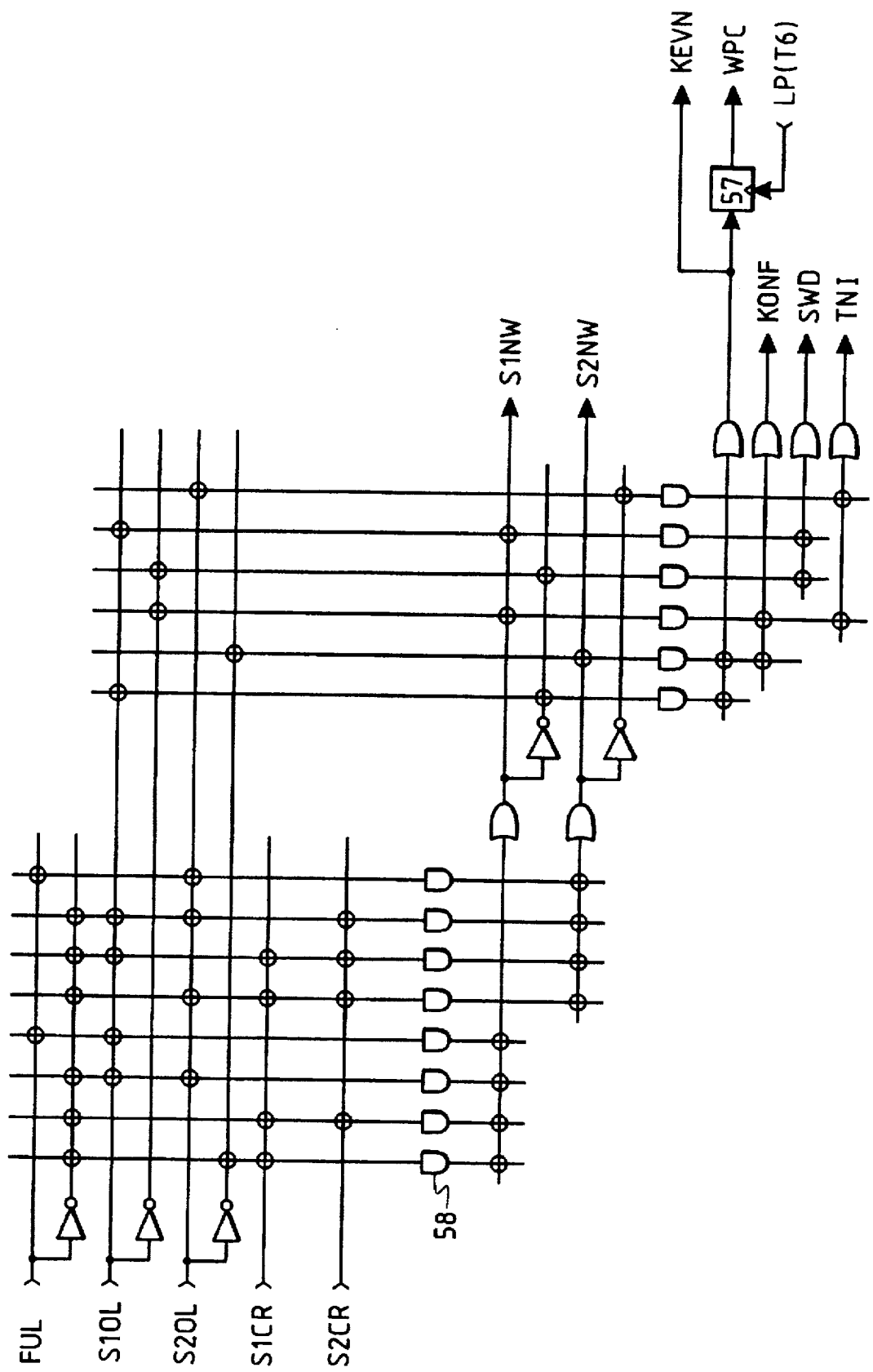
FIG. 5 is a block diagram (1) showing the construction of a decoder circuit 22.
Figure 6:
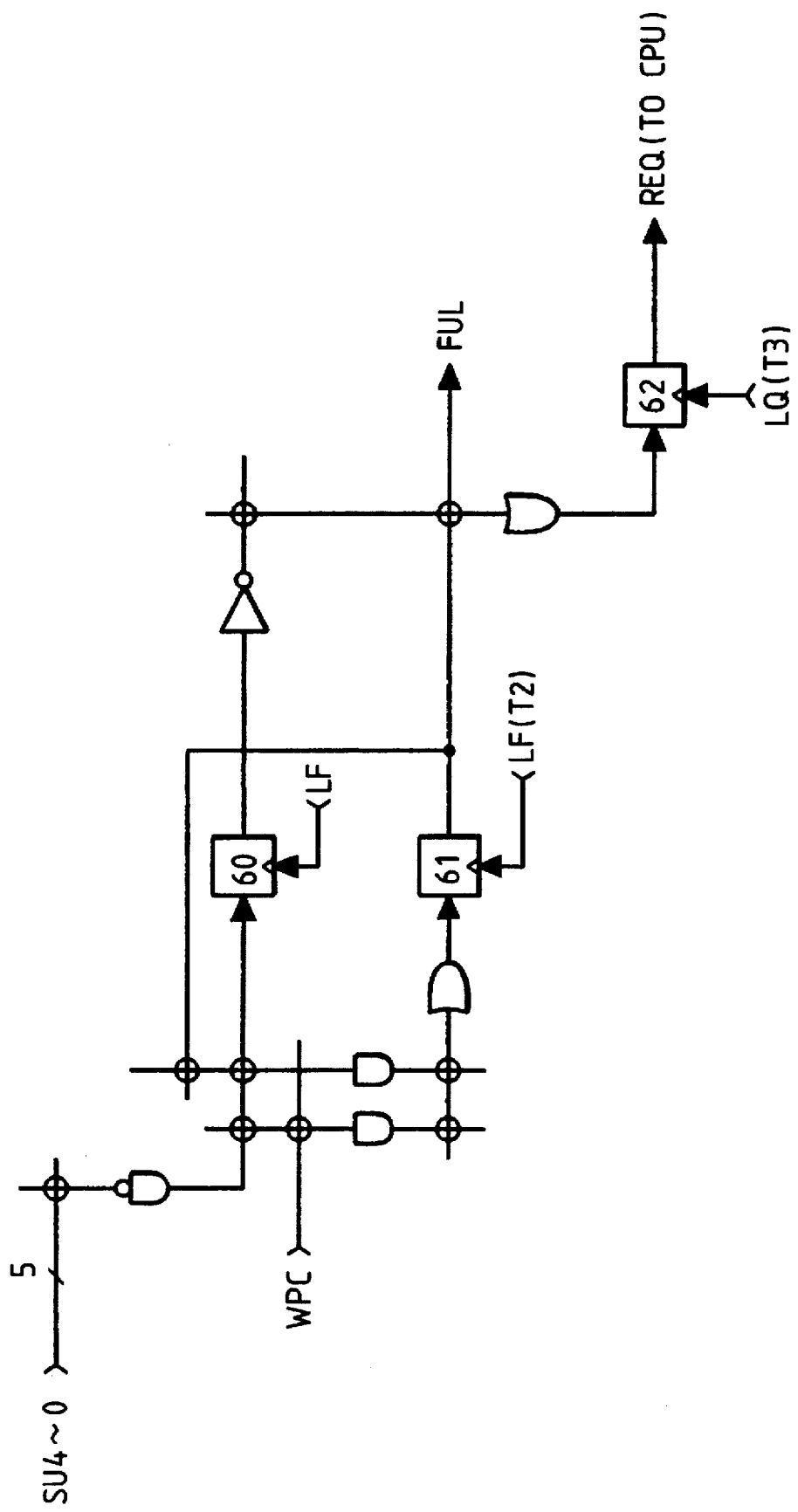
FIG. 6 is a block diagram (2) showing the construction of the decoder circuit 22.

FIGS. 5 and 6 are block diagrams showing the construction of the decoder circuit 22. When a signal FUL indicating a no-empty status in the buffer 24, preceding status signals S1OL and S2OL, and status signals S1CR and S2CR from which chattering was removed are input, the circuit of FIG. 5 generates status signals S1NW and S2NW containing no state which cannot be processed with the circuit construction as shown, and generates a signal KEVN indicating the occurrence of an event, a signal WPC controlling the write pointer of the output data buffer, a signal KONF identifying on/off, a signal SWD identifying S1/S2, and a signal TNI initializing touch data to a maximum value. In the figure, for instance, an AND circuit 58 is a three-input AND circuit to which the signals marked by a circle at intersections, that is, the inverted signal of FUL, the inverted signal of S2OL, and the S1CR signal are input (same in other figures).

Figures 10, 11:
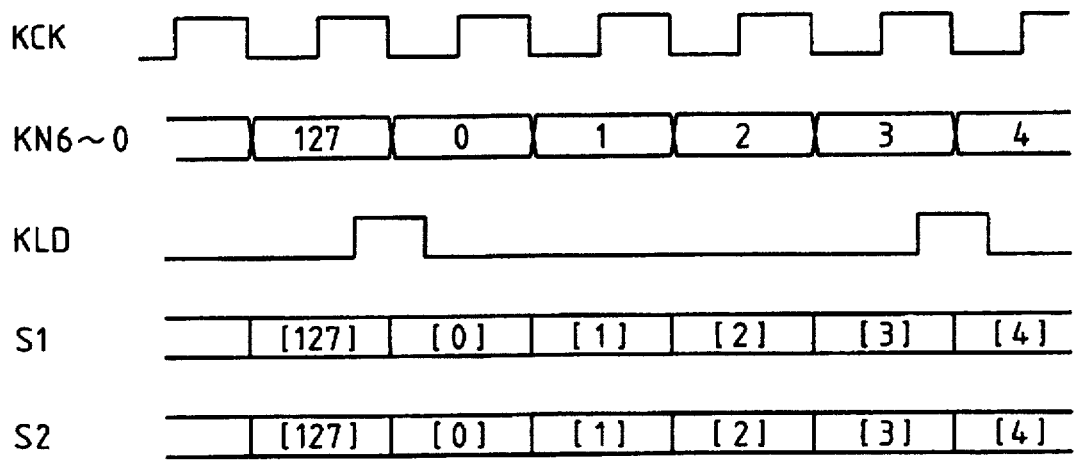
FIG. 10 is a figure showing the truth table of the circuit of FIG. 5.
FIG. 11 is a time chart showing the timing of the scan circuit 20.

FIG. 10 is the truth table of the circuit of FIG. 5. The lines marked by star mark indicate that output signals S1NW and S2NW different from input signals S1CR and S2CR are output. For instance, in the lines 2, 6 and 10 of the table, a signal indicating that S2 is on is input regardless of S1 being off, but such state cannot exist, and a status signal indicating that both are off is output. Further, in the line 14 of the table, signals indicating that S1 is off and S2 is on are also input, and in this case, since previous status information S1OL and S2OL are both on, a status signal indicating that both switches are on is output. Furthermore, in the line 4, the preceding status indicates that both switches are off and the current input indicates that both are on, and such status rarely occurs if a key is very strongly hit, or after a buffer-full state described later. However, since a wrong touch strength signal would be output if such signal is input, it is converted to a signal indicating that only S1 is on. Key event information is output to the CPU 1 only for the cases that on or off is described in the KEVN column.

The circuit of FIG. 6 is a circuit for generating the signal FUL indicating that there is no empty space in the buffer and the request signal REQ to the CPU. And FUL is generated by an AND operation of an update signal of the write pointer to the buffer and a signal indicating that the difference between the write pointer (latch 73) and the read pointer (latch 72) has become zero. FUL indicats that there is no empty space in the output data buffer 24. REQ is generated when the difference between the write pointer and the read pointer is not zero, or when FUL is one. When FUL becomes one, the values of S1OL and S2OL are output as they are, and no status change is detected. In consequence, no more data is written to the buffer, there is no need for the provision of a complex circuit for processing such as temporarily stopping the operation of the key scan circuit.

Figure 7:
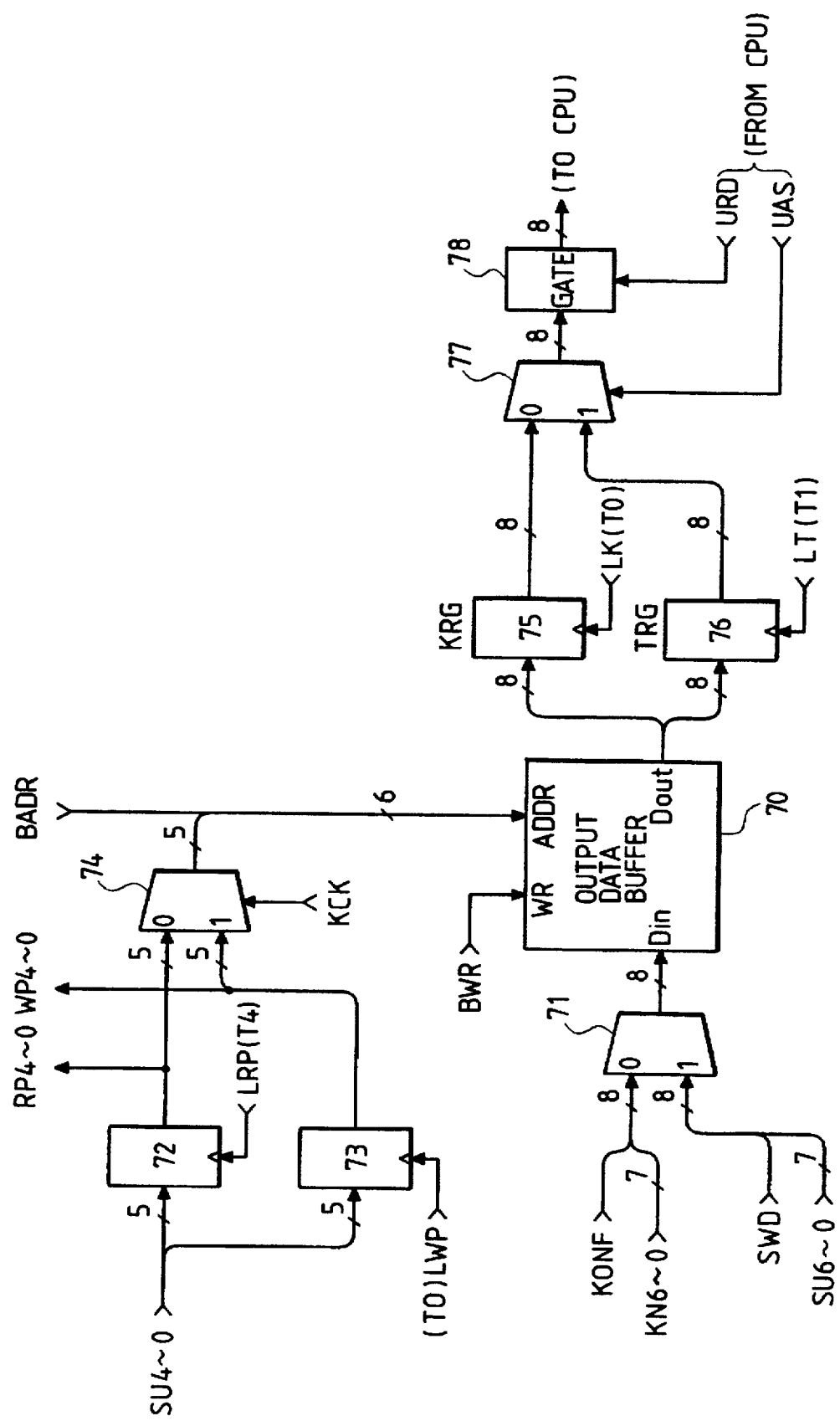
FIG. 7 is a block diagram showing the construction of an output data buffer 24.

FIG. 7 is a block diagram showing the construction of the output data buffer 24. An output data buffer 70 is a RAM having a memory map as shown in FIG. 9B, and latches 72 and 73 are latching read pointer data and write pointer data, respectively. The values of these pointer data are updated by the arithmetic circuit 23. Selectors 71 and 74 switch write data and address, respectively. Output data latches KRG 75 and TRG 76 latch on/off and key number, and S1/S2 and touch data, respectively. A selector 77 selects one data by a selection signal UAS from the CPU, and a gate 78 outputs the input signal from the selector 77 to the bus 9 based on a read control signal URD from the CPU.

Figure 8:
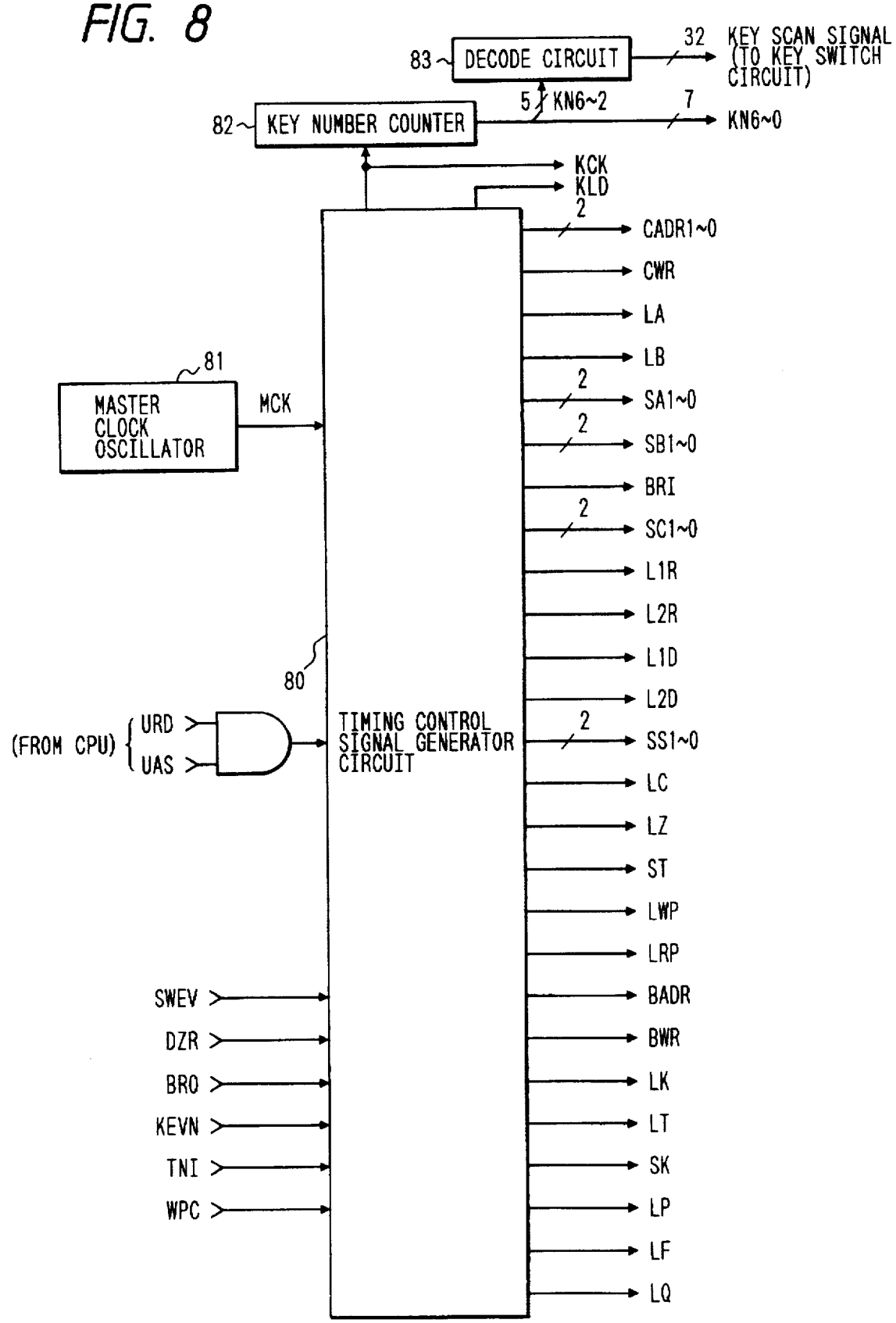
FIG. 8 is a block diagram showing the construction of a timing control signal generator circuit.

FIG. 8 is a block diagram showing the construction of the timing control signal generator circuit 25. From a master clock oscillator 81, for instance, a clock signal MCK of the order of 10 MHz is generated. A timing signal generator circuit 80 receives the clock signal MCK and such control signals as shown, and generates various control signals as shown by the counter and logical circuit it contains. A key number counter 82 counts (divides) a clock signal KCK output from the timing control signal generator circuit, thereby to output the signals KN6-0 which indicate key number processed now. A decode circuit 83 decodes the signal of the upper five bits of a key number signal to output a key scan signal.

The operation timing is now described.

FIG. 11 is a time chart showing the timing related to the scan circuit 20. A signal KLD is to load scan data into the shift registers 31 and 32 by four bits each, and they are shifted by the signal KCK to output serial scan signals S1 and S2.

Figure 12:
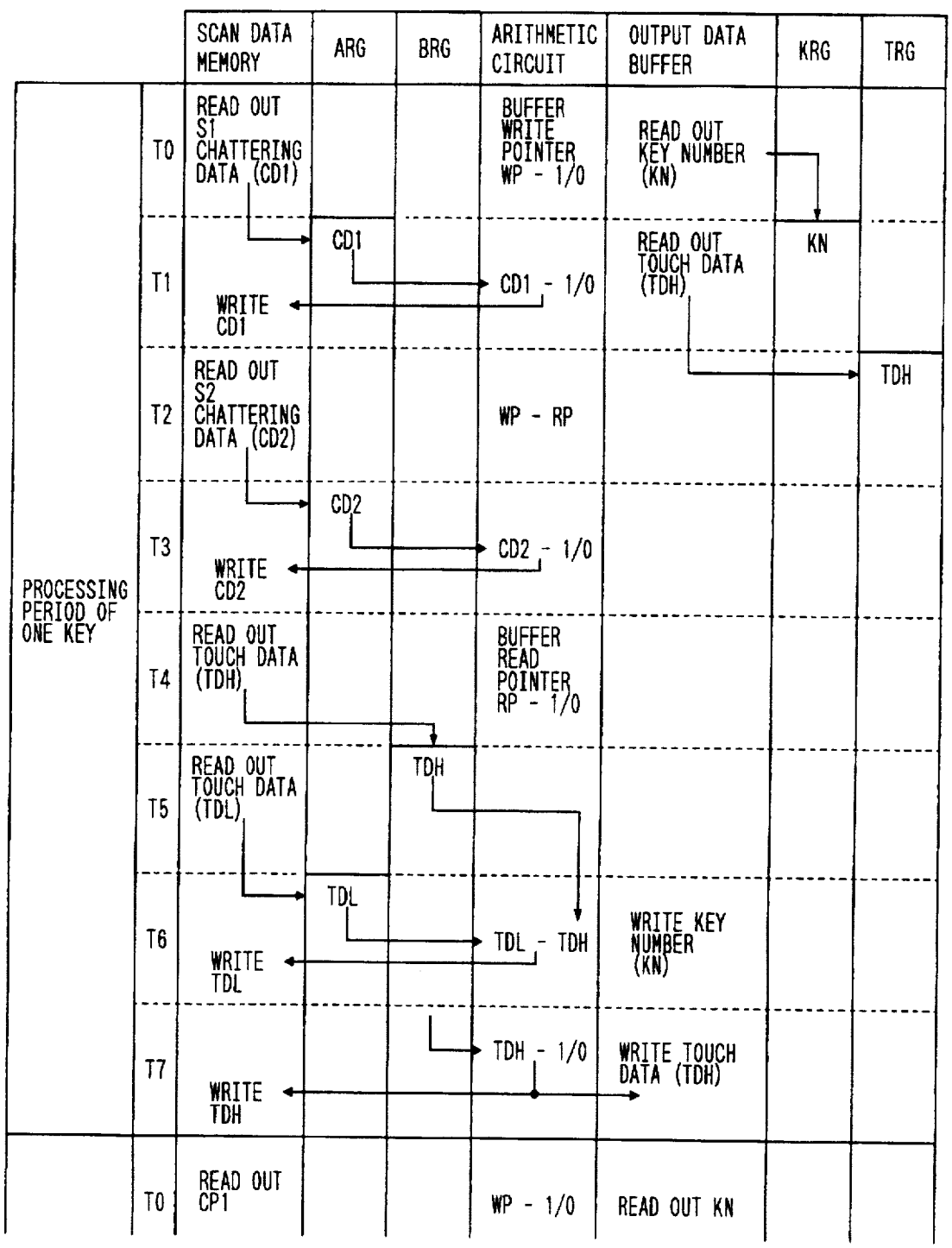
FIG. 12 is a figure showing the contents of the memory and the like at each timing.

FIG. 12 is a figure showing the contents of the data in the memory, latches and the like at each timing (T0–T7) in the processing period of one key. First, when the scan circuit 20 detects a status change (SWEV) of the switch S1 or S2, under the control of the timing control signal generator circuit 25, at timing T1 (or T3), a chattering data initial value other than zero is written to a corresponding area in the scan data memory 21. From the next processing period, at timing T0, the chattering data (CD1) of S1 is read out, and latched in a latch ARG 51 at timing T1, and if CD1 is not zero, one is subtracted from it in the arithmetic circuit 23 (by a signal BRI) and again written to the same address of the scan data memory 21. In addition, a signal which becomes "1" if the read data CD1 is not zero is generated by the OR circuit 50 in FIG. 4, and which is logical ORed with S1 by the OR circuit 49 to generate a signal S1CR.

Consequently, S1CR immediately turns to "1" once the switch S1 turns on, and since then, even if S1 repeats on and off due to chattering, it holds "1" until CD1 is reduced to "0" by subtraction. Accordingly, if the chattering initial value is set so that the period for chattering data to become "0" is longer than the chattering cycle, chattering can be removed. This is the same for key-off. Also, for the switch S2, a similar processing is performed at T2 and T3.

At T4 and later, the processing of touch data is performed. The arithmetic process is summarized as follows. When S1 turns on (or S2 turns off), the maximum value (127 since each is seven bits) is set in touch data (TDH, TDL). In a case other than this, $TD_n$ is updated by a calculation of $TD_n = TD_{n-1} - (TD_{n-1}/128)$. If $TD_n$ is expressed by TDH, upper seven bits, and TDL, lower seven bits, the above calculation becomes $TDL_n = TDL_{n-1} - TDH_{n-1}$ ... (1), $TDH_n = TDH_{n-1} -$ {borrow of equation (1)}. When S2 turns on (or S1 turns off), the value of TDH is output as touch strength data along with its key number as a key-on event (or key-off event).

In FIG. 12, at timing T4, the upper seven bits TDH of touch data is read out, and at T5, the lower seven bits TDL of touch data is read out. At T6, TDL−TDH is calculated, and the result is written to TDL. Also, the borrow signal at this time is latched in a latch 56, and at T7, the borrow signal (BRI) is subtracted from TDH is update TDH. Further, when S2 turns on, the value of the TDH is written to the output data buffer as touch strength data. In addition, the arithmetic circuit 23 performs the decrement (−1) of the write pointer 73 of the output data buffer at T0 if an event occurs, and at T2, subtracts the read pointer from the write pointer to check whether they are in coincidence, and at T4, decrement of the read pointer is performed if a read from the CPU occurs.

In the output data buffer 24, if a key-on or key-off event occurs, the key number data generated from the timing control signal generator circuit 25 is written to the address indicated by the write pointer at T6, and at T7, touch data (TDH) is written. In addition, at T0, a key number and on/off data are read out from the address indicated by the read pointer and latched in a latch KRG 75, and at T1, touch data (TDH) and S1/S2 data are latched in a latch TRG 76. These values are asynchronously read out from the CPU 1.

Figure 13:
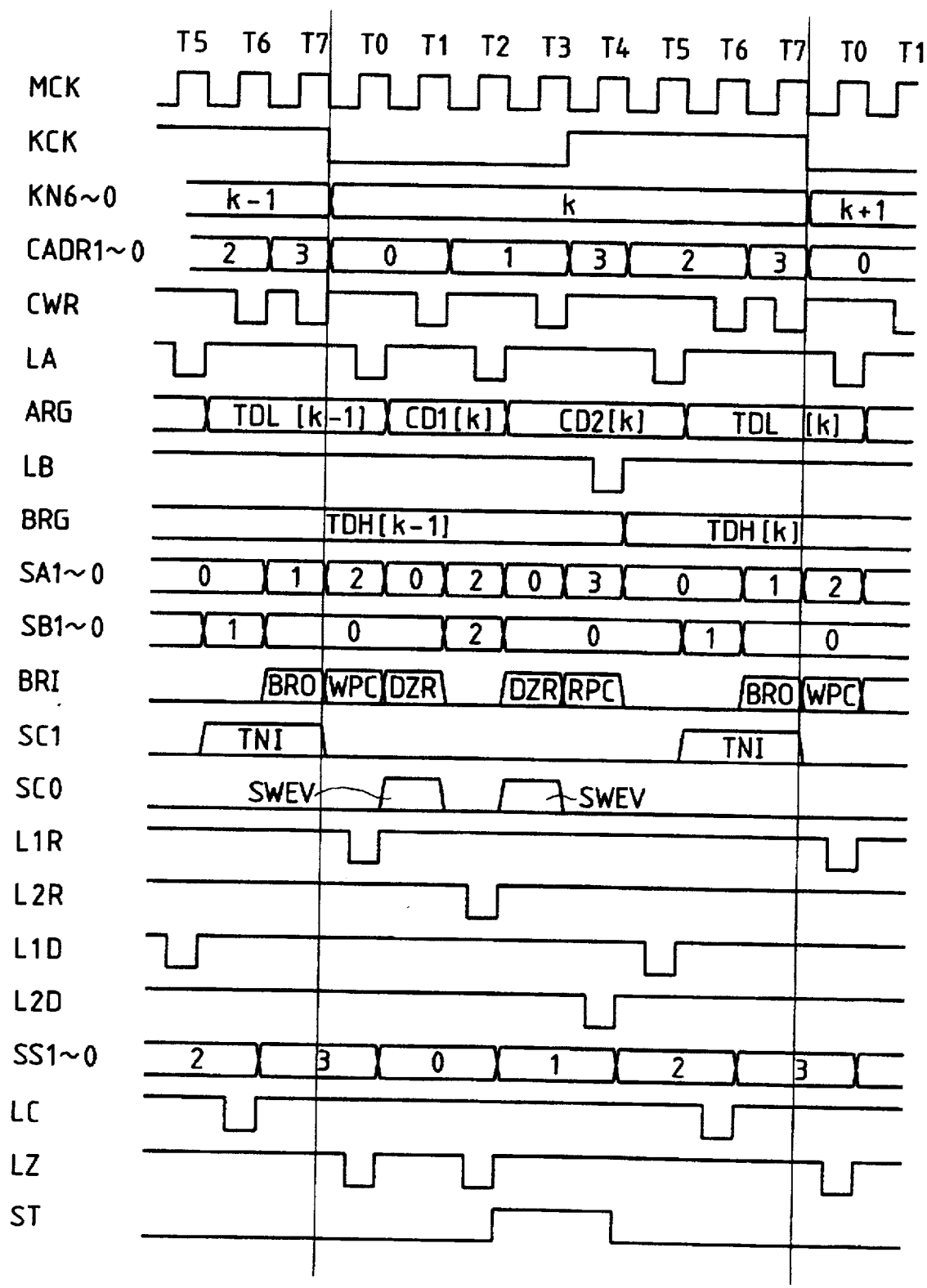
FIG. 13 is a time chart 1 showing the timing of the key scan circuit.
Figure 14:
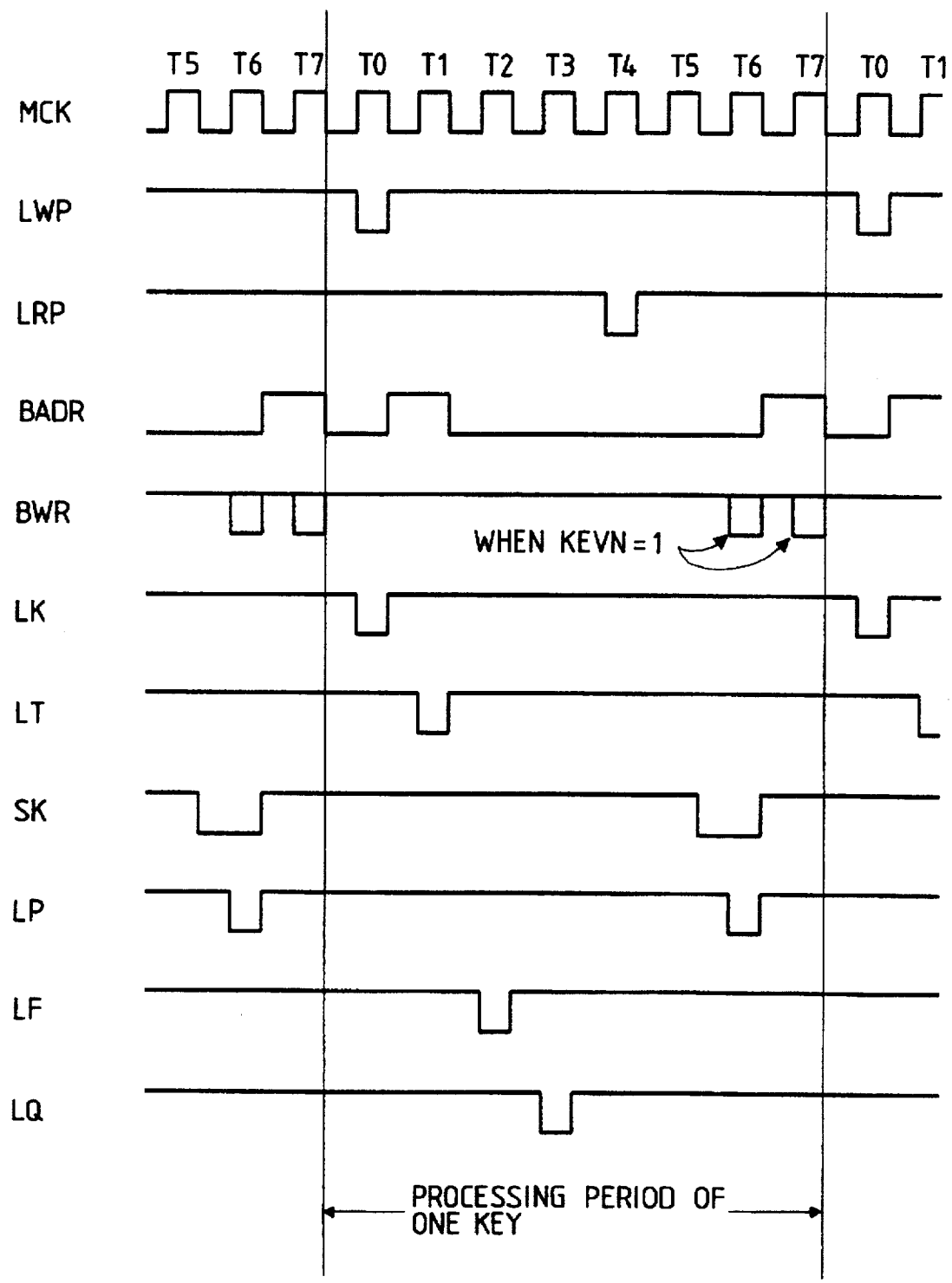
FIG. 14 is a time chart 2 showing the timing of the key scan circuit.

FIGS. 13 and 14 are timing charts showing timing signal waveforms during the processing period for one key of the key scan circuit 11. The respective circuits shown in FIGS. 3 to 8 perform the operations as shown in FIG. 12 by timing signals as shown in FIGS. 13 and 14 at the respective timings T0 to T7. In the figures, the numeric 0 to 3 of the upper two-bit signal CADR1, 0 of the address of the scan data memory and the line of the selection signal of each selector indicates that a two-bit signal representing the particular numeric is input. In addition, the portions of the lines for the respective signal lines ARC, BRG, BRI, SC1 and SC0 in which a signal name is written means that the particular signal line takes the value of the signal name. The processing period of one key is, for instance, one to two microseconds, and if there are 128 keys for instance, the processing period for scanning all the keys is 256 microseconds or less. The triangular mark at part of the strobe input terminals of the latches and the like in the respective circuit diagrams indicate that data is latched at the rise of a signal.

Figure 15:
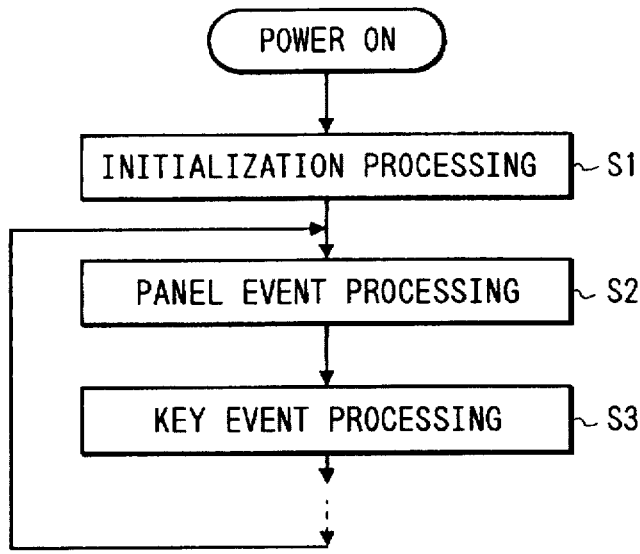
FIG. 15 is a flowchart showing the main processing of a CPU 1.
Figure 16:
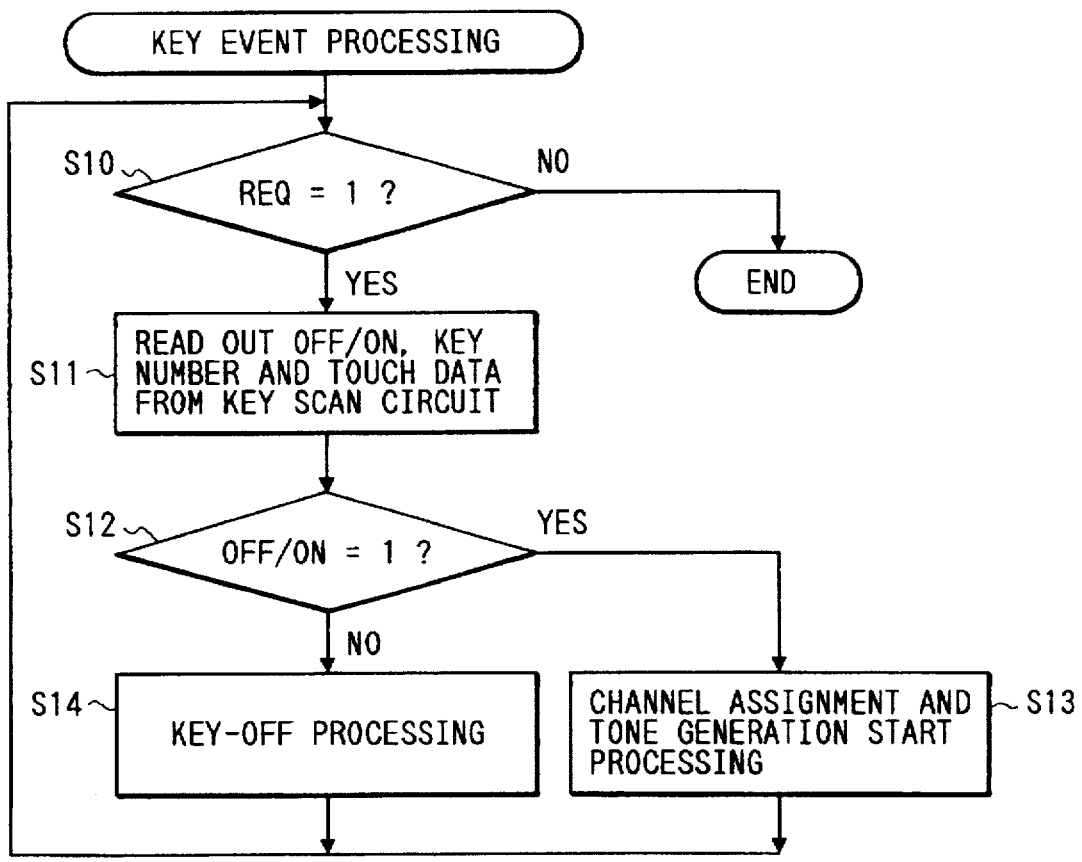
FIG. 16 is a flowchart showing the key event processing of the CPU 1.

Finally, FIGS. 15 and 16 are flowcharts showing the operation of the CPU 1. In the flowchart of the main processings shown in FIG. 15, the initialization processing at the power-on time is performed at step S1 to initialize the data in the CPU, RAM and musical tone generator circuit. At step S2, a panel event processing is performed to scan the statuses of the panel switches and the like, and if a status change is detected a corresponding processing is carried out. At step S3, a key event processing to be described later is performed, and after other processings, the flow returns to step S2 to repeat the main processings.

FIG. 16 is a flowchart showing the key event processing at step S3 of FIG. 15. At step S10, the CPU 1 reads from the input port the signal REQ output from the key scan circuit 11 to check whether or not the REQ is "1", and terminates the processing if the result is negative, otherwise goes to step S11. At step S11, the CPU 1 generates a signal URD (I/O port read control signal) and a signal UAS (read address signal), and read out on/off, key number data and touch strength data (and S1/S2 Information) from the key scan circuit 11. At step S12, it is checked whether or not the read OFF/ON data is one, or key-on, and if key-on, the flow advances to step S13 where a free tone generation channel is assigned by a well-known key assign processing and various parameters such as tone color (waveform) and envelope are set, whereby the tone generation is started. In addition if key-off at step S12, the flow goes to step S14 where a key-off processing such as attenuation of tone generation is performed for the corresponding tone generation channel.

Although the embodiment has been described above, the following variations may be made.

The decoder circuit 22 is constructed by a wired logic circuit as shown in FIGS. 5 and 6, but it may be implemented, for instance, by a ROM or RAM storing the output information as shown in FIG. 10, by which the output signals may also be arbitrarily set. Although an example has been disclosed in which the CPU reads the request signal REQ from a port, the CPU may be interrupted by the REQ signal.

As described above, in accordance with the electronic musical instrument of the present invention, the provision of the decode means as described above in the key scan circuit produces an advantage that wrong event or touch data can be prevented from being output, and in addition, eliminates the need for a additional circuit for preventing wrong data output, which enables the implementation with a simple construction.

What is claimed is:

1. An electronic musical instrument which generates musical tone signals based on playing information input from a keyboard having a plurality of keys, each key being provided with a first and second switches, the first switch operating first at the time of key-on, the second switch operating first at the time of key-off, the electronic musical instrument comprising:

a scan means for sequentially generating current status information on the first and second switches, a memory means for storing the status information on the first and second switches, a decode means for being supplied, for each key, with a current status information generated by the scan means and the previous status information read out from the memory means, and if the current status information being physically irrational is supplied, converting it to a physically logical status and outputting as a corrected status information avoiding outputting malfunctions due to noise, wherein the memory means stores the output status information from the decode means for each key as the previous status information, and a playing information generation means for outputting playing information based on the output information from the decode means.

2. An electronic musical instrument as set forth in claim 1 wherein each key has two switches operating at different timings, and the decode means is such that, if status information is input which indicates that the first switch operating first is off and the second switch operating later is on, it outputs status information indicating that both switches are on if the previous status information indicates both switches being on, otherwise it outputs status information indicating that both switches are off.

3. An electronic musical instrument as set forth in claim 1 wherein each key has two switches operating at different timings, and the decode means is such that, if status information is input which indicates that the first switch operating first and the second switch operating later simultaneously turn to on, it outputs status information indicating that only the first switch is on.

4. An electronic musical instrument as set forth in claim 1 further comprising an output buffer means for storing playing information which is the output from said playing information generation means, and outputting no-empty information to the decode means if there is no empty space, and wherein the decode means, upon receipt of the no-empty information, outputs the previous status information read out from the memory means as output status information, without making any change.

5. An electronic musical instrument as set forth in claim 1 wherein said memory means stores touch information calculation data and calculation data for chattering removal for each key, and includes as arithmetic circuit for performing the time sharing processing of at least two calculations of the calculation of touch data, the calculation for chattering removal and the address calculation of the output buffer means for each key.

* * * * *